(12) United States Patent
Andreaco et al.

(10) Patent No.: US 9,809,900 B2
(45) Date of Patent: Nov. 7, 2017

(54) CRYSTAL GROWTH CHAMBER WITH O-RING SEAL FOR CZOCHRALSKI GROWTH STATION

(71) Applicant: Siemens Medical Solutions USA, Inc., Malvern, PA (US)

(72) Inventors: Mark S. Andreaco, Knoxville, TN (US); Troy Marlar, Knoxville, TN (US); Brant Quinton, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 347 days.

(21) Appl. No.: 14/519,162

(22) Filed: Oct. 21, 2014

(65) Prior Publication Data

US 2015/0114285 A1    Apr. 30, 2015

Related U.S. Application Data

(60) Provisional application No. 61/897,487, filed on Oct. 30, 2013.

(51) Int. Cl.
  *C30B 15/00*    (2006.01)
  *C30B 15/16*    (2006.01)
  *C30B 15/14*    (2006.01)

(52) U.S. Cl.
  CPC .............. *C30B 15/00* (2013.01); *C30B 15/14* (2013.01); *C30B 15/16* (2013.01); *Y10T 29/49817* (2015.01); *Y10T 29/49826* (2015.01); *Y10T 117/106* (2015.01)

(58) Field of Classification Search
  CPC ........ C30B 15/00; C30B 15/14; Y10T 117/10
  See application file for complete search history.

(56) References Cited

U.S. PATENT DOCUMENTS

| | | | | |
|---|---|---|---|---|
| 3,615,928 A | * | 10/1971 | Wagner | C30B 15/00 117/17 |
| 3,769,230 A | * | 10/1973 | Robinson | C09K 11/7773 252/301.4 H |
| 3,857,679 A | * | 12/1974 | Allred | C30B 15/14 117/204 |
| 4,073,355 A | * | 2/1978 | Schmidt | G01G 17/04 117/201 |
| 4,134,785 A | * | 1/1979 | Lavigna | C30B 15/04 117/15 |
| 4,258,003 A | * | 3/1981 | Hurle | C30B 15/28 117/202 |
| 4,521,272 A | * | 6/1985 | Gault | C30B 11/003 117/223 |
| 4,800,100 A | * | 1/1989 | Herbots | C23C 14/221 117/105 |
| 6,203,614 B1 | * | 3/2001 | Cherko | C30B 15/30 117/208 |
| 6,421,130 B1 | * | 7/2002 | Phillion | G01N 21/03 356/450 |
| 2009/0126633 A1 | * | 5/2009 | Hardin | H01J 37/32605 118/723 E |

(Continued)

*Primary Examiner* — Matthew Song

(57) ABSTRACT

A growth chamber or a Czochralski crystal growth station has one or more re-sealable caps that are inserted into the chamber body. An O-ring seals the cap within its mating portion of the chamber body. The re-sealable caps facilitate re-use of the chamber body for a future crystal growth cycle.

6 Claims, 3 Drawing Sheets

(56) References Cited

U.S. PATENT DOCUMENTS

2010/0242836 A1\* 9/2010 Korb ................... C30B 15/28
  117/201
2011/0308449 A1\* 12/2011 Katsuno ............... C30B 23/005
  117/84

\* cited by examiner

CRYSTAL GROWTH CHAMBER WITH O-RING SEAL FOR CZOCHRALSKI GROWTH STATION

CROSS-REFERENCE TO RELATED APPLICATIONS

This application claims the benefit of priority to U.S. provisional patent application entitled "CHOCHRALSKI GROWTH STATION O-RING SEAL" filed Oct. 30, 2013 and assigned Ser. No. 61/897,487, which is incorporated by reference herein.

BACKGROUND OF THE INVENTION

1. Field of the Invention

The invention relates to growth chambers for Czochralski process crystal growth stations. More particularly the invention relates to reusable growth chambers employing one or more re-sealable caps with O-ring seals.

2. Description of the Prior Art

Known growth chambers used in Czochralski process crystal growth stations generally employ a temperature resistant chamber body with open ends that are sealed by mating caps, so that the chamber interior is isolated from ambient atmosphere. The chamber body is typically constructed of quartz with metal end caps. The open ends of the chamber body and the mating caps are typically sealed with a self-curing caulk, such as RTV silicone caulk. When RTV or other caulk is employed to seal the growth chamber for all practical purposes the sealed joint is permanently sealed. It becomes challenging to separate the cap or caps from the chamber body ends without damaging the chamber. Typically the chamber body damage caused during RTV caulk sealed component separation renders the chamber unserviceable for future crystal growth fabrication.

Known chamber caps often include cooling channels for circulation of cooling fluid during a crystal growth cycle, in order to compensate for their relatively faster and greater thermal expansion rate than the chamber body material, in order to avoid cracking of the latter. Chamber cracks developed during a crystal growth cycle greatly risks damage of the crystal boule and also destroys the growth chamber, with the consequences of either result causing undesirable economic loss. Therefore the cap cooling flow rate needs to be monitored so that the cap does not expand too quickly relative to the chamber body. Conversely the cap cooling flow rate must not be so fast, so that chamber body expansion does not break the chamber body/cap seal junction.

SUMMARY OF THE INVENTION

In accordance with exemplary embodiments described and shown herein, Czochralski growth station growth chambers are constructed with selectively re-sealable caps, such as lid caps or base caps, which are inserted into one or more open ends of the chamber body. The gap between the cap and chamber body end is sealed with an O-ring that is interposed between the two mating components. The O-ring facilitates selective assembly of the growth chamber prior to initiation of a crystal growth cycle, disassembly of the chamber after a crystal growth cycle without damage to the chamber body or caps, and reuse of the undamaged chamber components for future crystal growth. The O-ring seals are relatively compliant for preservation of chamber sealing despite disparate thermal expansion rates between the cap and chamber body materials. A sufficiently large gap between the cap and chamber body can be selectively chosen to compensate for those varying thermal expansion rates, while maintaining desired chamber sealing properties. Accordingly, this thermal compensation sealing flexibility reduces cap cooling flow and flow monitoring sensitivity compared to chambers that are sealed with RTV or other caulk compounds.

Exemplary embodiments of the invention feature a growth chamber apparatus for a Czochralski crystal growth station. The growth chamber comprises a hollow chamber body having open upper and lower ends; a base cap having a necked portion for slidable insertion into the chamber body lower end; and a lid cap having a necked portion for slidable insertion into the chamber body upper end. An O-ring is interposed between the at least one of the chamber body ends and its corresponding necked portion of the base or lid, for selective sealing of the growth chamber there between.

Other exemplary embodiments of the invention feature a growth chamber apparatus for a Czochralski crystal growth station, comprising a hollow chamber body having open upper and lower ends; a base cap having a necked portion for slidable insertion into the chamber body lower end; and a lid cap having a necked portion for slidable insertion into the chamber body upper end. An O-ring is interposed between the at least one of the chamber body ends and its corresponding necked portion of the base or lid, for selective sealing of the growth chamber there between.

Additional exemplary embodiments of the invention feature a method for sealing a growth chamber apparatus for a Czochralski crystal growth station, comprising providing a hollow chamber body having an open end and a cap having a necked portion for slidable insertion into the chamber body open end and orienting an O-ring between the chamber body open end and the necked portion. The method is completed by sliding the necked portion into the chamber body open end, thereby interposing the O-ring there between.

The respective features of the exemplary embodiments of the invention may be applied jointly or severally in any combination or sub-combination by those skilled in the art.

BRIEF DESCRIPTION OF THE DRAWINGS

The teachings of the exemplary embodiments of the invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will realize that the exemplary embodiments of the invention can be utilized in Czochralski crystal growth station growth chambers that facilitate selective assembly, disassembly and reassembly for reuse in future crystal growth cycles. O-ring seals are used to seal the chamber body ends one or more of their respective caps, such as a base cap or a lid cap. The O-rings enable selective insertion and separation of necked portions of base or lid caps from their mating chamber body open ends without causing permanent damage to the chamber body that otherwise would render it unserviceable for future re-use. In some embodiments the O-ring sealing properties facilitate establishment of a thermal expansion gap between the cap and the chamber body mating end surfaces to compensate for varying expansion rates of those component materials while maintaining a sealed condition between the components. In this manner the growth chamber is isolated from ambient atmosphere during a crystal growth cycle. In some embodiments the lid and base caps incorporate cooling channels for circulation of cooling fluid, so that the O-rings are not overheated during a crystal growth cycle.

Figure 1:
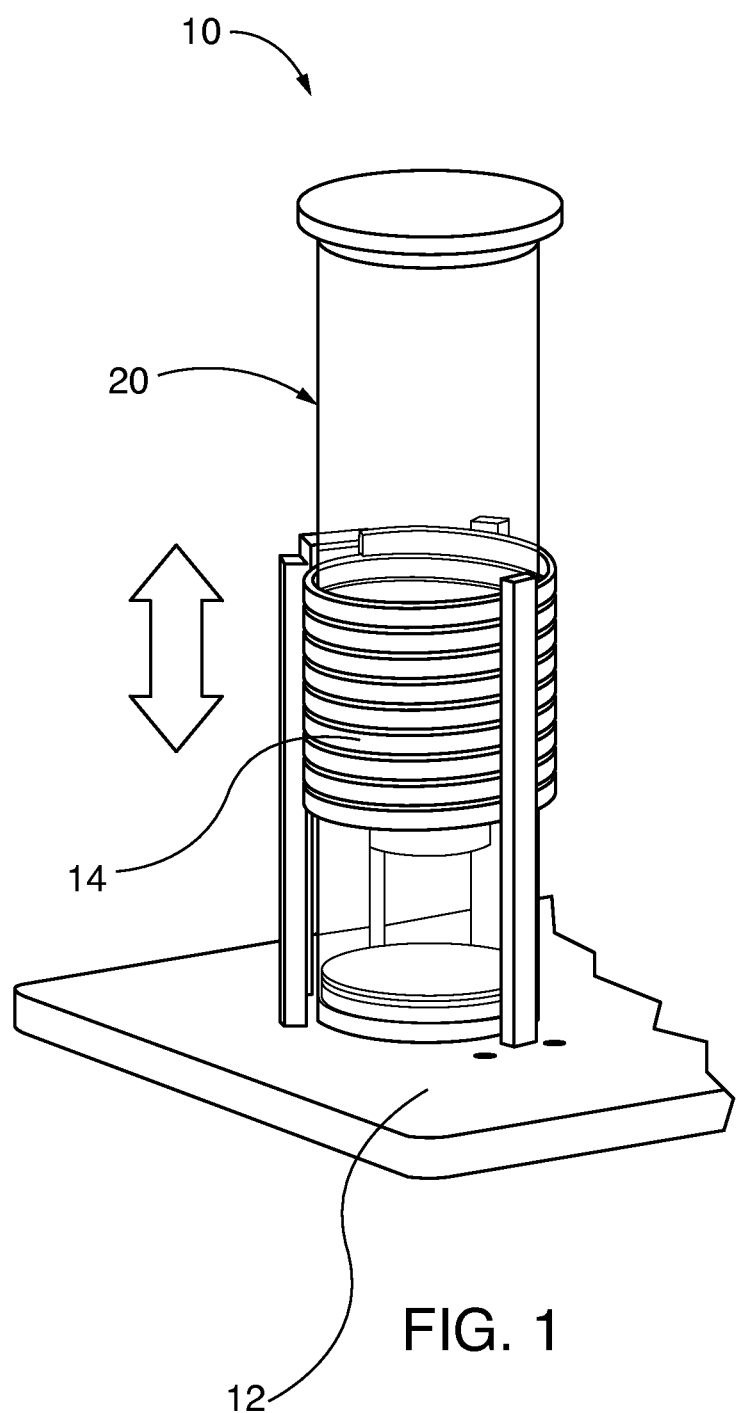
FIG. 1 is a fragmented perspective view of an exemplary Czochralski crystal growth station that includes a growth chamber constructed in accordance with an exemplary embodiment of the invention.

FIG. 1 shows an exemplary known Czochralski crystal growth station 10 that incorporates an exemplary embodiment of a growth chamber apparatus 20 of the invention. The growth station 10 has a base 12 that supports a radio frequency (RF) heater 14 into which is inserted the growth chamber 20. The growth chamber 20 is selectively positioned relative to the RF heater 14 during a crystal growth cycle, as shown by the double arrow, by a known pulling head, which is not shown for simplicity of the figure. The pulling head independently pulls a growing crystal boule relative to the chamber body and its contained crucible (not shown). Again for simplicity of the figure, known internal components within the growth chamber 20, such as the crucible, ceramic insulation layers, apparatus for introducing and evacuating inert gas within the chamber, etc. are not shown.

Figure 2:
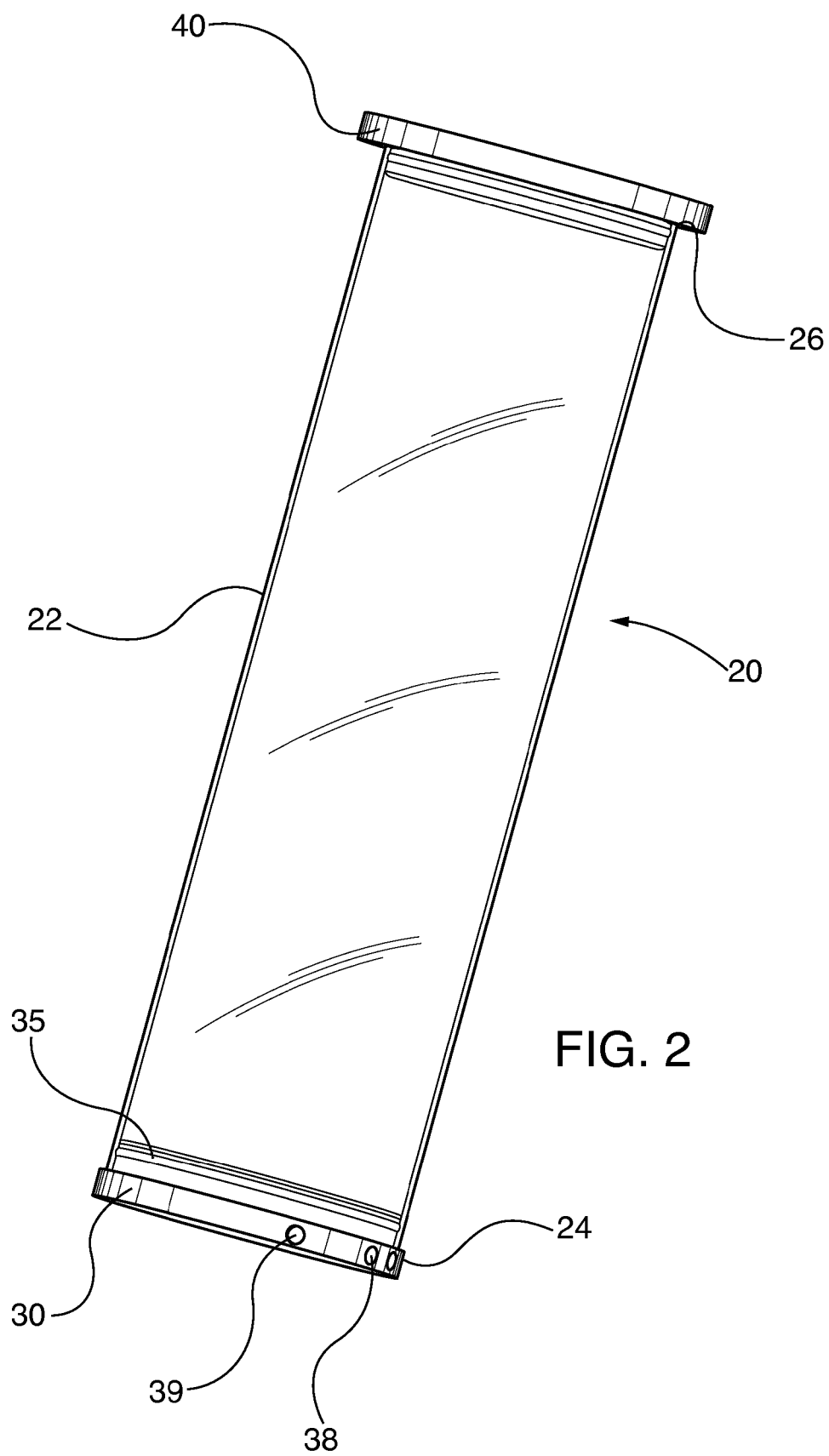
FIG. 2 is a perspective view of an assembled growth chamber that is constructed in accordance with an exemplary embodiment of the invention.

The assembled growth chamber 20 is shown in FIG. 2 and includes a chamber body 22 with a lower end 24 and an upper end 26. Exemplary chamber bodies 20 are constructed of quartz material, with upper 26 and lower 24 ends swaged to a desired—here cylindrical—profile for mating with caps. While a tubular profile chamber body 22 is shown in FIG. 2, other shapes may be substituted for the tubular profile.

Figure 4:
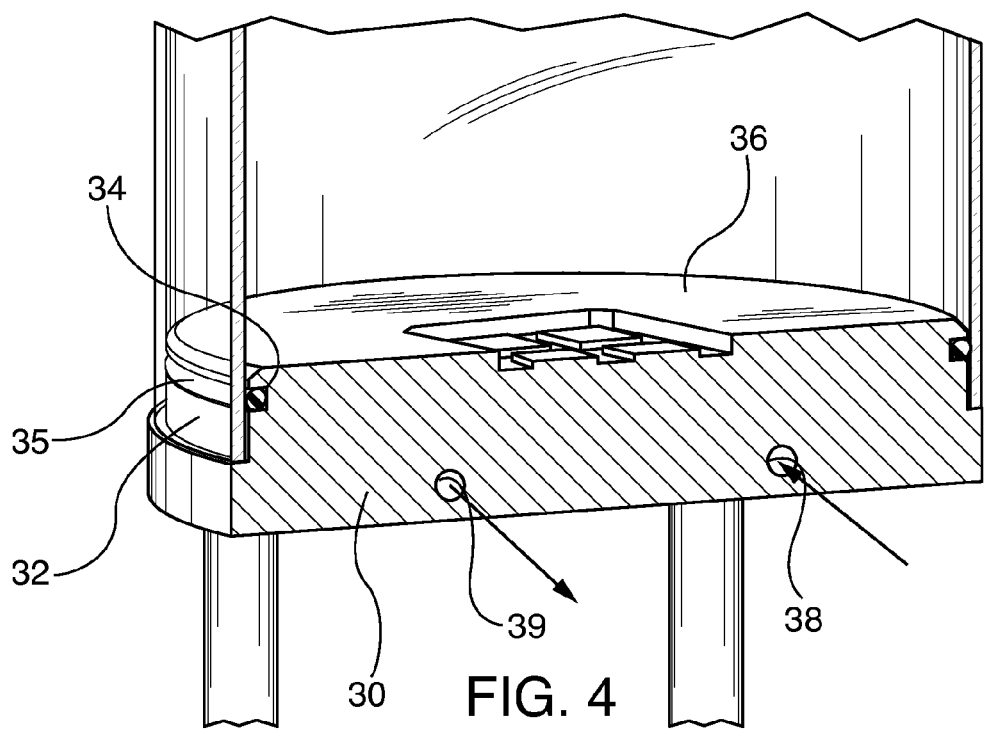
FIG. 4 is an axial cross sectional view of a chamber body lower end cap of the growth chamber of FIG. 2.

Referring to FIGS. 2 and 4, Base cap 30 has a base necked portion 32 that is sized to be slidably inserted into the tube lower end 24. The neck portion 32 has an O-ring recess 34 for receipt of O-ring 35. The O-ring 35 seals the gap between the neck portion 32 of the base cap 30 and the chamber body lower end 24, in order to isolate the chamber 20 from ambient atmospheric air. Exemplary O-rings are constructed of resilient FKM-type elastomer materials, such as VITON® elastomers, sold by DuPont Performance Elastomers LLC. While a circular cross section O-ring 34 is shown, other configurations of sealing rings, such as rectangular or square cross section rings can be substituted for circular ones. Similarly, while the O-ring recess 34 is shown in the base cap 30, the mating cap and chamber body opposed surfaces can be constructed with the recess in either component or both. In some embodiments the recess 34 feature can be eliminated entirely. The base inner face 36 defines a floor of the growth chamber 20. Optional known construction cooling channels can be constructed in the base cap 30, in order to prevent overheating of the cap or the O-ring. In FIG. 4 the base 30 base cooling channels communicate with cooling inlet 38 and the coolant is exhausted through cooling outlet 39.

Figure 3:
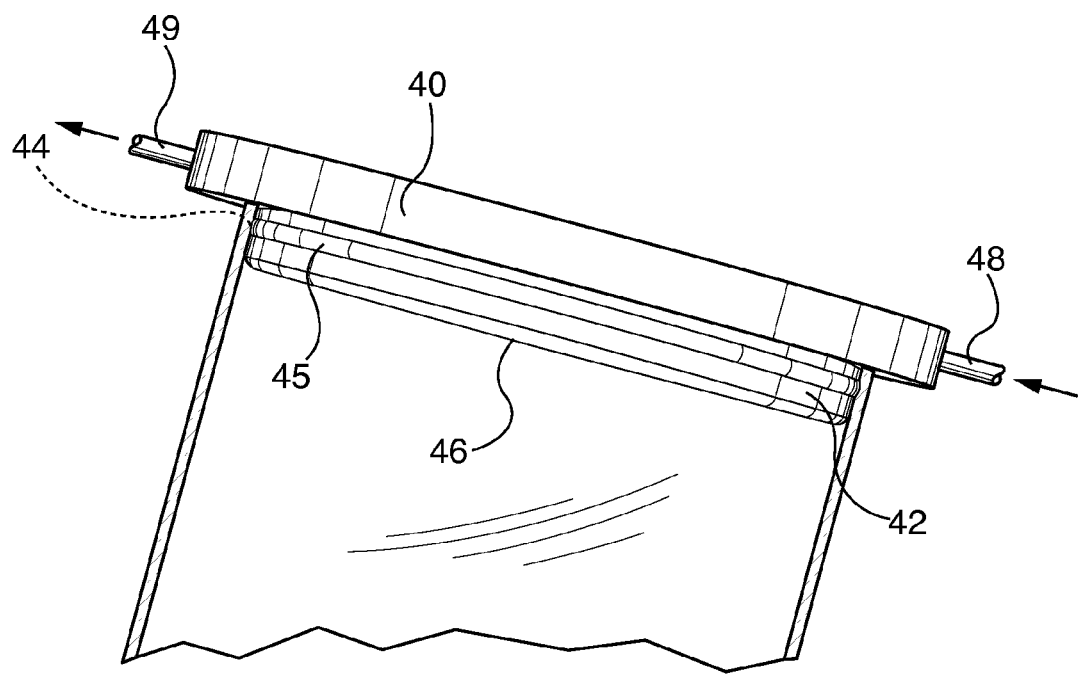
FIG. 3 is a partial cross sectional view of a chamber body upper end and base cap of the growth chamber of FIG. 2.

The exemplary growth chamber 20 also includes a lid cap 40, as shown in FIGS. 2 and 3. The lid cap 40 includes sealing structures similar to those of the previously described base cap 30. More particularly the lid 40 has a lid necked portion 42 that is slidably engaged in the upper end 26 of the chamber body 22, an optional O-ring recess 44 that retains O-ring 45 and a lid inner face 46 that defines the top of the growth chamber 20. Optional known construction cooling channels can be constructed in the lid cap 40, in order to prevent overheating of the cap or the O-ring. In FIG. 3 the lid 40 cooling channels communicate with cooling inlet 48 and the coolant is exhausted through cooling outlet 49.

While the exemplary embodiment growth chamber 20 is shown with O-ring sealed removable base cap 30 and lid cap 40, a single cap can be utilized in a growth chamber of the invention and the cap does not have to be oriented directly on the bottom or top of the chamber body 22.

The growth chamber 20 is assembled by inserting the respective O-rings 35 and 45 into their respective O-ring recesses 34, 44 and thereafter sliding the respective base cap 30 and lid cap 40 necked portions 32, 42 into engagement with the chamber body 22 lower 24 and upper 26 ends. After a crystal boule is grown the growth chamber 20 is opened by withdrawal of the base 30 and lid 40 caps from engagement with the chamber body respective ends 24 and 26. O-rings facilitate insertion and withdrawal of the caps 30, 40 from the chamber body 22 without damaging the latter's relatively delicate, brittle quartz engagement surfaces. By preserving service life of the chamber body 22 it can be reused in a subsequent crystal boule fabrication cycle.

Although various embodiments that incorporate the teachings of the present invention have been shown and described in detail herein, those skilled in the art can readily devise many other varied embodiments that still incorporate these teachings. The invention is not limited in its application to the exemplary embodiment details of construction and the arrangement of components set forth in the description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

What is claimed is:
1. A method for growing a crystal with a Czochralski crystal growth station, comprising:
   providing a Czochralski crystal growth station, including:
      a radio frequency (RF) heater circumscribing a growth chamber;
      a crucible retained within an interior of the growth chamber;
      a base supporting the RF heater, the crucible, and the growth chamber;
      the provided growth chamber including the following components:
         a hollow, non-metallic chamber body, constructed of quartz, having open upper and lower ends, the upper and lower ends respectively defining inner circumferential surface walls having respective upper and lower inner circumferential dimensions;

a metallic base cap having first internal cooling channels formed therein for circulating cooling fluid there through, the base cap having a male necked portion, defining a base cap circumferential dimension smaller than the circumferential dimension of the inner circumferential surface wall of the chamber body lower end, for slidable insertion into the inner circumferential surface wall of the chamber body lower end;

a metallic lid cap having second internal cooling channels formed therein for circulating cooling fluid there through, the lid cap having a male necked portion, defining a lid cap circumferential dimension smaller than the circumferential dimension of the inner circumferential surface wall of the chamber body upper end, for slidable insertion into the inner circumferential surface wall of the chamber body upper end;

a base cap thermal expansion gap defined between the base cap necked portion and the inner circumferential surface wall of the chamber body lower end upon insertion of the base cap necked portion into the lower end of the chamber body;

a lid cap thermal expansion gap defined between the lid cap necked portion and the inner circumferential surface wall of the chamber body upper end upon insertion of the lid cap necked portion into the upper end of the chamber body;

a flexibly compliant, lower O-ring, constructed of FKM-type elastomer material, for interposition between the inner circumferential surface wall of the lower open end of the chamber body the male necked portion of the base cap;

a flexibly compliant, upper O-ring, constructed of FKM-type elastomer material, for interposition between the inner circumferential surface wall of the upper open end of the chamber body and the male necked portion of the lid cap;

assembling the growth chamber by orienting the lower O-ring between the inner circumferential surface wall of the corresponding lower open end of the chamber body and the corresponding male necked portion of the base cap and sliding its necked portion into the corresponding lower open end, thereby sealing and defining the base cap thermal expansion gap;

inserting a crucible into an interior of the chamber body, which defines the interior of the growth chamber, above the now sealed base cap and below the upper open end of the chamber body;

circumscribing the assembled growth chamber and crucible with the RF heater, so that the base cap is oriented over the base;

orienting the upper O-ring between the inner circumferential surface wall of the corresponding upper open end of the chamber body and the corresponding male necked portion of the lid cap and sliding its necked portion into the corresponding upper open end, thereby sealing and defining the lid cap thermal expansion gap and capturing the crucible within the chamber body interior, isolated from ambient atmosphere;

confirming that the respective lid and base caps and the respective upper and lower O-rings are sealed relative to their respective open ends of the chamber body circulating cooling fluid within the first and second internal cooling channels of the respective base cap and lid cap, in order to reduce thermal expansion of the respective male necked portions thereof, and maintain larger corresponding base cap and lid cap thermal expansion gaps when the chamber body, base cap and lid cap are heated, as compared to respective caps that do not have circulating cooling fluid;

filling the interior of the chamber body with a quantity of inert gas, thereby isolating said interior from ambient atmosphere;

heating the assembled growth chamber and crucible with the RF heater, and growing a crystal therein, while maintaining sealing isolation integrity between the respective, mating, corresponding interfaces between the necked portions of the base and lid caps, the upper and lower O-rings, and the upper and lower, inner circumferential surfaces of the open ends of the chamber body, as the corresponding base and lid cap thermal expansion gap expands or contracts during crystal growth.

2. The method of claim 1, further comprising providing an O-ring recess formed within a corresponding inner circumferential surface wall of the upper or lower end of the chamber body, for retaining the O-ring.

3. The method of claim 1, further comprising providing an O-ring recess formed in the corresponding male necked portion of the base cap or the lid cap, for retaining the respective corresponding first or second O-ring.

4. The method of claim 1, the chamber body comprising a quartz tube.

5. The method of claim 4, the quartz tube having swaged upper and lower ends forming the respective inner circumferential surface walls.

6. The method of claim 1, further comprising disassembling the growth chamber after a crystal growth fabrication by retracting either or both of the male necked portion of the base cap and/or the lid cap from its corresponding open end without damaging the chamber body and reusing the chamber body for future crystal growth fabrication.

* * * * *